US012723137B2

(12) United States Patent
Luo et al.

(10) Patent No.: US 12,723,137 B2
(45) Date of Patent: Sep. 1, 2026

(54) RESIN COMPOSITION, INSULATING RESIN FILM AND USE THEREOF

(71) Applicant: SHENGYI TECHNOLOGY CO., LTD., Dongguan (CN)

(72) Inventors: Cheng Luo, Dongguan (CN); Shanyin Yan, Dongguan (CN); Jiangling Zhang, Dongguan (CN)

(73) Assignee: SHENGYI TECHNOLOGY CO., LTD., Dongguan (CN)

( * ) Notice: Subject to any disclaimer, the term of this patent is extended or adjusted under 35 U.S.C. 154(b) by 258 days.

(21) Appl. No.: 18/541,487

(22) Filed: Dec. 15, 2023

(65) Prior Publication Data

US 2024/0228765 A1 Jul. 11, 2024

(30) Foreign Application Priority Data

Dec. 29, 2022 (CN) ........................ 202211714646.7

(51) Int. Cl.
*C08L 53/02* (2006.01)
*C08J 5/24* (2006.01)
(Continued)

(52) U.S. Cl.
CPC ............... *C08L 53/02* (2013.01); *C08J 5/249* (2021.05); *C08L 9/00* (2013.01); *C08L 25/16* (2013.01);
(Continued)

(58) Field of Classification Search
None
See application file for complete search history.

(56) References Cited

U.S. PATENT DOCUMENTS

2007/0249792 A1* 10/2007 Kawahara ............. C08F 210/14 526/170
2021/0198395 A1* 7/2021 Hayes .................. C08F 212/32
2024/0182703 A1* 6/2024 Wang ........................ C08L 9/06

FOREIGN PATENT DOCUMENTS

CN 111806016 A 10/2020
CN 113185940 A 7/2021
(Continued)

OTHER PUBLICATIONS

Moon—Dev thermoplastic prepreg solution-bond method—J.Appl. Poly.Sci.—1993 (Year: 1993).*

(Continued)

*Primary Examiner* — John Vincent Lawler
(74) *Attorney, Agent, or Firm* — NORTON ROSE FULBRIGHT US LLP

(57) ABSTRACT

Resin composition, insulating resin film and use thereof. The resin composition comprises the following components in parts by mass: 50-90 parts of a hydrogenated hydrocarbon resin and 10-50 parts of a benzocyclobutene resin; the benzocyclobutene resin comprises at least one structural unit A and at least one structural unit B. The hydrogenated hydrocarbon resin and the benzocyclobutene resin with a specific structure are both total-hydrocarbon structures, having low dielectric constant Dk, dielectric loss tangent Df, and water absorption rate. The benzocyclobutene resin can be thermally cured to obtain the high cross-linking density, high glass transition temperature, and excellent heat resistance. The resin composition and the insulating resin film prepared therewith have ultra-low dielectric constant and loss tangent, excellent dielectric properties, heat resistance, damp heat resistance, adhesion strength, and excellent mechanical properties such as flexibility, satisfying the per- (Continued)

formance requirements of electronic components being high frequency, high speed, and high integration.

15 Claims, 1 Drawing Sheet

(51) Int. Cl.

| | |
|---|---|
| ***C08L 9/00*** | (2006.01) |
| ***C08L 25/16*** | (2006.01) |
| ***C09D 109/00*** | (2006.01) |
| ***C09D 125/16*** | (2006.01) |
| ***C09D 153/02*** | (2006.01) |
| ***H05K 1/03*** | (2006.01) |

(52) U.S. Cl.
CPC ......... *C09D 109/00* (2013.01); *C09D 125/16* (2013.01); *C09D 153/02* (2013.01); *H05K 1/032* (2013.01); *C08J 2309/00* (2013.01); *C08J 2325/16* (2013.01); *C08J 2353/02* (2013.01); *C08J 2409/00* (2013.01); *C08J 2425/16* (2013.01); *C08J 2453/02* (2013.01)

(56) References Cited

FOREIGN PATENT DOCUMENTS

| | | | | |
|---|---|---|---|---|
| CN | 113831875 A | | 12/2021 | |
| CN | 117069877 A | * | 11/2023 | ............. B32B 17/02 |

OTHER PUBLICATIONS

Borisenko—MWD of styrene-butadiene rubber—2015 (Year: 2015).*
Chang—CN 117069877 A—MT—claimed copolymer+hydrogenated resin—circuit board—2023 (Year: 2023).*

* cited by examiner

RESIN COMPOSITION, INSULATING RESIN FILM AND USE THEREOF

CROSS-REFERENCE TO RELATED APPLICATIONS

This patent application claims the benefit of priority from Chinese Patent Application No. 202211714646.7 filed Dec. 29, 2022, which is hereby incorporated herein by reference in its entirety:

TECHNICAL FIELD

The present application belongs to the technical field of communication materials, and specifically relates to a resin composition, an insulating resin film and use thereof.

BACKGROUND

With the advent of the 5G communication era, electronic components are rapidly developing towards higher speed and higher integration. However, with the increased routing density for ultra-large-scale integrated circuits, the resistance of the metal interconnecting wires inside the electronic component can easily produce resistance capacitance delay (RC delay) with the capacitance of interlayer dielectrics, which thereby causes undesirable effects such as delayed signal transmission, noise interference, and power loss. In the high-speed, high-frequency transmission technology, the signal transmission speed (v) and signal propagation loss rate (a) of dielectric materials are two key performance indicators, and the values of v and a are closely related to the dielectric constant of dielectric materials (Dk): in general, the v value of high-frequency circuit boards is inversely proportional to the Dk of dielectric materials, while the a value is directly proportional to the dielectric constant (Dk) and the dielectric loss tangent (Df) of dielectric materials. Therefore, it has great value to develop an insulating dielectric material having low Dk and low Df for reducing interconnect delay, minimizing energy consumption and avoiding crosstalk.

CN113185940A discloses an insulating adhesive film composition and its application in a printed circuit board, and the insulating adhesive film composition comprises, in parts by mass, 0.5-5 parts of a polystyrene resin, 5-50 parts of an epoxy resin, 2-20 parts of a curing agent, 0.01-1 parts of a curing accelerator, and 1-100 parts of an inorganic filler: the polystyrene resin is a polystyrene resin having oxazoline backbone, and the introduction of the polystyrene resin having oxazoline backbone into the epoxy resin composition contributes to the low dielectric effect, and a good adhesion strength is also obtained even with the low surface roughness. Although the introduction of the oxazoline styrene resin can reduce the dielectric loss, the copper clad laminate prepared therefrom has a Df value of 0.006-0.010 at 1 GHZ, and such dielectric loss cannot satisfy the requirements for signal transmission at high frequency.

CN111806016A discloses an insulating adhesive film and a preparation method therefor, wherein the insulating adhesive film consists of three layers, i.e., a support film, a dielectric film, and a cover film from the bottom to the top: the dielectric film is arranged in the middle to form a sandwich structure, and the dielectric film includes upper, middle, and lower dielectric layer: the upper and lower dielectric layers are made of an epoxy resin compound electronic paste, and in the epoxy resin compound electronic paste, a filler has a content of 8 wt %-40 wt %; the middle dielectric layer is made of an epoxy resin compound electronic paste, and in the epoxy resin compound electronic paste, a filler has a content of 40 wt %-90 wt %. The insulating adhesive film balances the relationship between the coefficient of thermal expansion with the mechanical strength and adhesion strength by regulating the filler contents of the dielectric layers, and can be applied to the dielectric layers of semiconductor electronic packaging fields such as encapsulated substrates, encapsulated loading boards, and fan-out panel level packaging rerouting: however, the dielectric loss of the insulating adhesive film is high, which will seriously affect high-frequency substrates in the quality of signal transmission.

CN113831875A discloses an insulating adhesive film, raw materials of which include the following components: 20-30 parts of liquid epoxy resin, 30-40 parts of multifunctional epoxy resin, 10-30 parts of phenoxy resin, 20-40 parts of phenolic resin, and 60-180 parts of modified spherical silica micropowder: the insulating adhesive film has good roughness after roughness treatment, and after chemical copper deposition, the base copper has great adhesion strength on the insulating film surface, which is suitable for semi-additive process for preparing PCB circuit boards: however, its dielectric loss is high, and electrochemical performance is poor.

At present, the insulating adhesive film has been widely used in printed circuit boards and chip packaging, but the existing insulating adhesive film material has insufficient dielectric properties, seriously affecting its application in integrated circuits. The insulating adhesive film products with good dielectric properties can support the development of electronic components towards high speed and high integration, and therefore, improving the dielectric properties of insulating adhesive film and reducing its dielectric loss as well is an urgent problem to be solved to increase the signal transmission speed and circuit density in the art.

SUMMARY

In view of the shortcomings of the prior art, the present application is to provide a resin composition, an insulating resin film and use thereof; a benzocyclobutene resin with a specific structure is compounded with a hydrogenated hydrocarbon resin, and accordingly, the resin composition and the insulating resin film prepared therewith have ultra-low dielectric constant and ultra-low dielectric loss, and at the same time have excellent heat resistance and adhesion strength, satisfying the development requirements of electronic components for high frequency, high speed, and high integration.

To achieve the object of the present application, the present application adopts the technical solutions below.

In a first aspect, the present application provides a resin composition, and the resin composition comprises the following components in parts by mass: 50-90 parts of a hydrogenated hydrocarbon resin and 10-50 parts of a benzocyclobutene resin.

The benzocyclobutene resin comprises at least one structural unit A and at least one structural unit B; the structural unit A has a structure as shown in formula I:

formula I

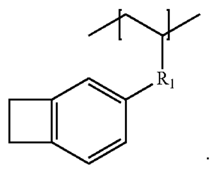

In formula I, $R_1$ is vinylidene and/or ethylidene.

The structural unit B has a structure as shown in formula II:

formula II

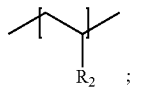

In formula II, $R_2$ is vinyl, ethyl and/or phenyl.

The resin composition provided by the present application comprises a combination of the hydrogenated hydrocarbon resin and benzocyclobutene resin in specific amounts. The benzocyclobutene resin comprises structural unit A containing a benzocyclobutene structure, and structural unit B containing any one or a combination of at least two of a polybutadiene structure, a hydrogenated poly butadiene structure, and a polystyrene structure: the benzocyclobutene resin and the hydrogenated hydrocarbon resin are both total-hydrocarbon structures, which have low dielectric constant Dk, low dielectric loss tangent Df, low polarity, and low water absorption rate; meanwhile, the molecular structure of benzocyclobutene resin contains the C═C unsaturated bond and the benzocyclobutene ring that forms C═C through thermal ring opening, and the benzocyclobutene resin can be thermally cured to obtain better dielectric properties; moreover, the resin structure contains a plurality of benzocyclobutene functional groups, which will has high cross-linking density, high glass transition temperature, and excellent heat resistance after the thermal curing reaction. The resin composition and the insulating resin film prepared therewith have ultra-low dielectric constant, ultra-low dielectric loss, and excellent dielectric properties.

and at the same time have excellent heat resistance, adhesion strength, and excellent mechanical properties such as flexibility, can be used as dielectric materials to enhance signal transmission speed and reduce signal propagation loss, satisfying the performance requirements of electronic components being high frequency: high speed, and high integration.

In the resin composition provided by the present application, the hydrogenated hydrocarbon resin is 50-90 parts, which may be, for example, 55 parts. 60 parts. 65 parts. 70 parts. 75 parts. 80 parts or 85 parts, or specific point values between any two of the above point values, and for the space limitation and concision consideration, the specific point values included in the range will not be exhaustively listed in the present application.

The benzocyclobutene resin is 10-50 parts, which may be, for example, 10 parts. 15 parts. 20 parts. 25 parts. 30 parts. 35 parts. 40 parts or 45 parts, or specific point values between any two of the above point values, and for the space limitation and concision consideration, the specific point values included in the range will not be exhaustively listed in the present application.

In the present application, the hydrogenated hydrocarbon resin is compounded with the benzocyclobutene resin in a specific ratio, giving the resin composition excellent dielectric properties, heat resistance, damp heat resistance, adhesion strength and flexibility; if the amount of the hydrogenated hydrocarbon resin is too much while the amount of the benzocyclobutene resin is too little, the dielectric properties and heat resistance of the resin composition will be affected: and if the amount of the hydrogenated hydrocarbon resin is too little, the flexibility of the insulating resin film will decrease.

Preferably, the hydrogenated hydrocarbon resin comprises a fully hydrogenated hydrocarbon resin and/or a partially hydrogenated hydrocarbon resin, which means that the specific examples of hydrogenated hydrocarbon resin hereinafter all comprise the fully hydrogenation and the partially hydrogenation.

Preferably, the hydrogenated hydrocarbon resin comprises any one or a combination of at least two of a hydrogenated styrene-butadiene copolymer, a maleic anhydride grafted hydrogenated styrene-butadiene copolymer, and hydrogenated poly butadiene.

Herein, the "styrene-butadiene copolymer" involved includes a styrene-butadiene random copolymer and/or a styrene-butadiene block copolymer, preferably a styrene-butadiene-styrene triblock copolymer (SBS): thereby the hydrogenated styrene-butadiene copolymer is a hydrogenated styrene-butadiene-styrene triblock copolymer (SEBS).

Preferably, the hydrogenated hydrocarbon resin comprises any one or a combination of at least two of a hydrogenated styrene-butadiene-styrene triblock copolymer (SEBS), maleic anhydride grafted SEBS, and hydrogenated poly butadiene.

Preferably, the hydrogenated hydrocarbon resin has a number average molecular mass of 3000-200000, which may be, for example, 5000, 8000, 10000, 20000, 50000, 80000, 100000, 120000, 150000 or 180000, or specific point values between any two of the above point values, and for the space limitation and concision consideration, the specific point values included in the range will not be exhaustively listed in the present application. The molecular mass (including number average and weight average) referred to herein is determined by the gel permeation chromatography (GPC) method based on polystyrene calibrant in GB/T 21863-2008.

Preferably, the structural unit A of the benzocyclobutene resin has a molar percentage of more than or equal to 5%, which may be, for example, 5%, 10%, 15%, 20%, 25%, 30%, 35%, 40%, 45%, 50%, 55%, 60%, 65%, 70%, 75% or 80%, or specific point values between any two of the above point values, and for the space limitation and concision consideration, the specific point values included in the range will not be exhaustively listed in the present application; more preferably, the molar percentage is more than or equal to 30%, and further preferably 30-60%.

Preferably, the structural unit B of the benzocyclobutene resin has a molar percentage of 15-90%, which may be, for example, 15%, 20%, 25%, 30%, 35%, 40%, 45%, 50%, 55%, 60%, 65%, 70%, 75%, 80% or 85%, or specific point values between any two of the above point values, and for the space limitation and concision consideration, the specific point values included in the range will not be exhaustively listed in the present application.

As a preferred technical solution of the present application, the structural unit A of the benzocyclobutene resin has a molar percentage of 5-80%, more preferably 30-60%, and the structural unit B has a molar percentage of 15-90%, more preferably 30-70%; accordingly, the benzocyclobutene resin has excellent dielectric properties, heat resistance, modulus and mechanical properties, and high thermal-curing cross-linking reactivity and crosslinking density.

If the molar percentage of structural unit A is too low, the heat resistance of the benzocyclobutene resin will be reduced, thereby affecting the glass transition temperature and heat resistance of the resin composition; if the molar percentage of structural unit A is too high, on the one hand, the synthesis difficulty and production cost will be increased, and on the other hand, the degree of crosslinking curing of the benzocyclobutene resin will be reduced, resulting in a decrease in the dielectric properties of the benzocyclobutene resin and the resin composition.

Preferably, the benzocyclobutene resin comprises structural unit A1 ($R_1$ is vinylidene) having a structure of

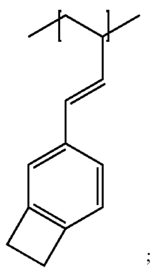

;

the molecular structure contains reactive vinylidene groups, which has high crosslinking efficiency in the thermal curing reaction.

Preferably, the benzocyclobutene resin comprises structural unit A2 ($R_2$ is ethylidene) having a structure of

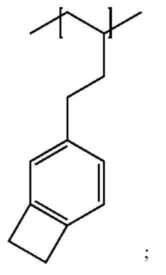

;

the molecular structure contains saturated carbon chains, which has relatively low dielectric loss.

Preferably, the benzocyclobutene resin comprises structural unit B1 ($R_2$ is vinyl) having a structure of

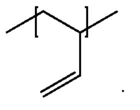

.

Preferably, the benzocyclobutene resin comprises structural unit B2 ($R_2$ is ethyl) having a structure of

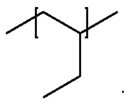

.

Optionally, the structural unit A2 can be obtained by hydrogenation of structural unit A1 and the structural unit B2 can be obtained by hydrogenation of structural unit B1; the introduction of hydrogenated structural unit A2 and/or structural unit B2 contributes to the further improvement of the dielectric properties of the benzocyclobutene resin and the resin composition. It should be noted that when $R_1$ of structural unit A in the benzocyclobutene resin is vinylidene, $R_2$ of structural unit B can be vinyl or ethyl; similarly, when $R_1$ of structural unit A in the benzocyclobutene resin is ethylidene, $R_2$ of structural unit B can be vinyl or ethyl. In other words, for the structural unit A and structural unit B in the benzocyclobutene resin, the polybutadiene double bond can be unhydrogenated, partially hydrogenated or fully hydrogenated.

Preferably, the benzocyclobutene resin comprises structural unit B3 ($R_2$ is phenyl) having a structure of

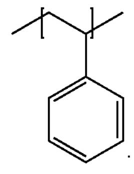

.

Preferably, the benzocyclobutene resin further comprises structural unit C, and the structural unit C has a structure as shown in formula IIIA and/or a structure as shown in formula IIIB:

formula IIIA

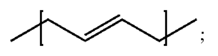

;

formula IIIB

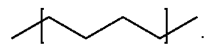

.

It should be noted that the benzocyclobutene resin of the present application is a polymer chain segment structure comprising at least one (preferably more than one) structural unit A, at least one (preferably more than one) structural unit B, and optionally structural unit C; in the present application, the connecting sequence of the above structural units is not limited, and any chemically feasible connecting sequence or connecting method is included in the scope of the present application.

Preferably, the structural unit C of the benzocyclobutene resin has a molar percentage of less than or equal to 40%, which may be, for example, 0, 1%, 3%, 5%, 8%, 10%, 15%, 20%, 25%, 30%, 35% or 40%, or specific point values between any two of the above point values, and for the space limitation and concision consideration, the specific point values included in the range will not be exhaustively listed in the present application; more preferably, the molar percentage is less than or equal to 30%, further preferably less than or equal to 20% and most preferably less than or equal to 10%. Accordingly, the benzocyclobutene resin and the resin composition containing the same will have increased curing degree, and higher glass transition temperature and better heat resistance.

Preferably, the benzocyclobutene resin has a number average molecular mass of 1000-20000, which may be, for example, 2000, 5000, 8000, 10000, 12000, 15000 or 18000, or specific point values between any two of the above point values, and for the space limitation and concision consideration, the specific point values included in the range will not be exhaustively listed in the present application.

Preferably, the resin composition further comprises an initiator.

Preferably, the resin composition comprises 0.1-3 parts by mass of initiator, and the initiator may be 0.2 parts by mass, 0.5 parts by mass, 0.8 parts by mass, 1 part by mass, 1.2 parts by mass, 1.5 parts by mass, 1.8 parts by mass, 2 parts by mass, 2.2 parts by mass, 2.5 parts by mass or 2.8 parts by mass, or specific point values between any two of the above point values, and for the space limitation and concision consideration, the specific point values included in the range will not be exhaustively listed in the present application.

Since the hydrogenated hydrocarbon resin in the resin composition provided by the present application has thermoplasticity, and the benzocyclobutene group in the benzocyclobutene resin is capable of thermal ring opening to realize curing crosslinking, the initiator is an optional component, and its amount may also be zero.

Preferably, the initiator comprises any one or a combination of at least two of an organic peroxide, an azo initiator, and a carbon radical initiator.

Preferably, the initiator comprises any one or a combination of at least two of tert-butyl isopropylphenyl peroxide, diisopropylbenzene peroxide, benzoyl peroxide, 2,5-dimethyl-2,5-bis(tert-butylperoxy)hexane, 2,5-dimethyl-2,5-bis (tert-butylperoxy)hexyne, 1,1-bis(tert-butylperoxy)-3,3,5-dimethylcyclohexane, bicumyl, and bicumyl polymer.

Preferably, the resin composition further comprises a filler.

Preferably, the resin composition comprises 5-300 parts by mass of filler, and for example, the filler may be 10 parts, 20 parts, 30 parts, 40 parts, 50 parts, 60 parts, 70 parts, 80 parts, 90 parts, 100 parts, 120 parts, 150 parts, 180 parts, 200 parts, 220 parts, 250 parts, or 280 parts, or specific point values between any two of the above point values, and for the space limitation and concision consideration, the specific point values included in the range will not be exhaustively listed in the present application; more preferably, the filler is 5-200 parts, and further preferably 5-150 parts.

Preferably, the filler is an inorganic filler and/or an organic filler, more preferably an inorganic filler.

Preferably, the inorganic filler comprises any one or a combination of at least two of a non-metal oxide, a metal oxide, a metal hydroxide, a metal nitride, a non-metallic nitride, an inorganic hydrate, an inorganic salt, a metal hydrate, and an inorganic phosphorus.

Preferably, the inorganic filler comprises any one or a combination of at least two of silica, aluminum hydroxide, alumina, talc, aluminum nitride, boron nitride, silicon carbide, barium sulfate, barium titanate, strontium titanate, calcium carbonate, calcium silicate, and mica:

Preferably, the silica may be any one or a combination of at least two of fused silica, crystalline silica, spherical silica, and hollow silica.

Preferably, the organic filler comprises any one or a combination of at least two of a polyphenylene ether filler (powders and/or microspheres), a polytetrafluoroethylene filler (powders), a polyether ether ketone filler, a polyphenylthioether filler, and a polyethersulfone filler (powders).

Preferably, the filler has a median particle size (D50) of 0.01-50 μm, which may be, for example, 0.05 μm, 0.1 μm, 0.5 μm, 1 μm, 5 μm, 10 μm, 15 μm, 20 μm, 25 μm, 30 μm, 35 μm, 40 μm or 45 μm, or specific point values between any two of the above point values, and for the space limitation and concision consideration, the specific point values included in the range will not be exhaustively listed in the present application; more preferably, the median particle size is 0.01-20 μm, and further preferably 0.01-10 μm.

Exemplarily, the particle size of the filler is determined by a MS3000 Malvern laser particle size analyzer.

Preferably, the filler comprises a filler after surface treatment.

Preferably, a surface treatment agent used in the surface treatment comprises any one or a combination of at least two of a silane coupling agent, an organosilicone oligomer, and a titanate coupling agent.

Preferably, based on a mass of the filler to be treated being 100 parts, a mass of the surface treatment agent is 0.1-5 parts, such as 0.2 parts, 0.5 parts, 0.8 parts, 1 part, 1.5 parts, 2 parts, 2.5 parts, 3 parts, 3.5 parts, 4 parts or 4.5 parts, or specific point values between any two of the above point values, and for the space limitation and concision consideration, the specific point values included in the range will not be exhaustively listed in the present application; more preferably, the mass of the surface treatment agent is 0.5-3 parts, and further preferably 0.75-2 parts.

Preferably, the resin composition further comprises a flame retardant.

Preferably, the resin composition comprises 1-50 parts by mass of flame retardant, and for example, the flame retardant may be 5 parts, 10 parts, 15 parts, 20 parts, 25 parts, 30 parts, 35 parts, 40 parts or 45 parts, or specific point values between any two of the above point values, and for the space limitation and concision consideration, the specific point values included in the range will not be exhaustively listed in the present application.

Preferably, the flame retardant comprises any one or a combination of at least two of a halogenated flame retardant (for example, a chlorine-containing flame retardant and/or a bromine-containing flame retardant), a nitrogen flame retardant, a phosphorus flame retardant, and a metal hydroxide flame retardant.

A solvent may also be added to the resin composition, and an amount of the solvent is selected by those skilled in the art based on experience as well as process requirements, as long as the resin composition gets a suitable viscosity for use and is convenient to be coated and impregnated. Subsequently, the solvent in the resin composition will partially or completely volatilizes away during the drying, semi-curing or complete-curing steps.

The solvent of the present application is not specially limited, which can be generally selected from ketones such as acetone, butanone and cyclohexanone, aromatic hydrocarbons such as toluene and xylene, esters such as ethyl acetate and butyl acetate, alcohols such as methanol, ethanol or butanol, alcohols such as ethyl cellosolve, butyl cellosolve, ethylene glycol monomethyl ether, carbitol or butyl carbitol, and nitrogen-containing species such as N,N-dimethylformamide, N,N-dimethylacetamide or N-methyl-2-pyrrolidone; the solvent can be used alone or in a mixture of two or more. Preferably, the solvent is ketones such as acetone, butanone and cyclohexanone, and aromatic hydrocarbons such as toluene and xylene.

The resin composition provided by the present application is prepared by the following method, and the preparation method comprises: mixing a hydrogenated hydrocarbon resin, a benzocyclobutene resin, an optional filler, an optional flame retardant and an optional solvent and dispersing them uniformly to obtain the resin composition.

In a second aspect, the present application provides an insulating resin film, and a material of the insulating resin film comprises the resin composition according to the first aspect.

Preferably, the insulating resin film is manufactured by coating the resin composition on a release material and then drying and/or semi-curing the same.

Preferably, the drying and the semi-curing independently have temperatures of 100-180° C., which may be, for example, 110° C., 115° C., 120° C., 125° C., 130° ° C., 135° C., 140° C., 145° C., 150° C., 155° C., 160° ° C., 165° C., 170° C. or 175° C., or specific point values between any two of the above point values, and for the space limitation and concision consideration, the specific point values included in the range will not be exhaustively listed in the present application.

Preferably, the drying and the semi-curing independently are carried out for a period of 1-30 min, which may be, for example, 2 min, 5 min, 8 min, 10 min, 15 min, 20 min or 25 min, or specific point values between any two of the above point values, and for the space limitation and concision consideration, the specific point values included in the range will not be exhaustively listed in the present application.

In a third aspect, the present application provides a resin-coated copper foil, and the resin-coated copper foil comprises a copper foil layer and a resin layer, and a material of the resin layer comprises the resin composition according to the first aspect.

Preferably, the resin-coated copper foil is manufactured by coating the resin composition on a copper foil and then drying and/or semi-curing the same.

In a fourth aspect, the present application provides a prepreg, and the prepreg comprises a reinforcing material and the resin composition according to the first aspect adhered on the reinforcing material.

Preferably, the resin composition is adhered on the reinforcing material by impregnation and drying.

Exemplarily, a preparation method of the prepreg comprise: impregnating the reinforcing material with a resin adhesive liquid of the resin composition and then drying the same to obtain the prepreg.

Preferably, the drying has a temperature of 100-180° C., which may be, for example, 110° C., 115° C., 120° C., 125° C., 130° C., 135° C., 140° C., 145° C., 150° C., 155° C., 160° C., 165° C., 170° ° C. or 175° C., or specific point values between any two of the above point values, and for the space limitation and concision consideration, the specific point values included in the range will not be exhaustively listed in the present application.

Preferably, the drying has a time of 1-30 min, which may be, for example, 2 min, 5 min, 8 min, 10 min, 15 min, 20 min or 25 min, or specific point values between any two of the above point values, and for the space limitation and concision consideration, the specific point values included in the range will not be exhaustively listed in the present application.

In a fifth aspect, the present application provides a metal foil clad laminate, and the metal foil clad laminate comprises at least one of the insulating resin film according to the second aspect, the resin-coated copper foil according to the third aspect, and the prepreg according to the fourth aspect.

Preferably, a metal foil of the metal foil clad laminate comprises any one or a combination of at least two of a copper foil, an aluminum foil, a nickel foil, and an alloy foil, more preferably a copper foil.

In a case where the metal foil is a copper foil, the metal foil clad laminate is a copper clad laminate.

Exemplarily, a preparation method of the metal foil clad laminate comprises: pressing a metal foil onto an insulating resin film on one or both sides, and curing the same to obtain the metal foil clad laminate: or laminating at least two insulating resin films into a laminate, then pressing a metal foil onto the laminate on one or both sides, and curing the same to obtain the metal foil clad laminate.

Preferably, the number of the insulating resin film in the metal foil clad laminate is 1-20, which may be, for example, 2, 5, 8, 10, 12, 15 or 18, or specific point values between any two of the above point values, and for the space limitation and concision consideration, the specific point values included in the range will not be exhaustively listed in the present application.

Preferably, the curing is carried out in a press.

Preferably, the curing has a temperature of 170-280° ° C., for example, 180° C., 190° ° C., 200° ° C., 210° C., 220° C., 230° C., 240° C., 250° ° C., 260° C. or 270° C., or specific point values between any two of the above point values, and for the space limitation and concision consideration, the specific point values included in the range will not be exhaustively listed in the present application.

Preferably, the curing has a pressure of 20-60 kg/cm$^2$, for example 25 kg/cm$^2$, 30 kg/cm$^2$, 35 kg/cm$^2$, 40 kg/cm$^2$, 45 kg/cm$^2$, 50 kg/cm$^2$ or 55 kg/cm$^2$, or specific point values between any two of the above point values, and for the space limitation and concision consideration, the specific point values included in the range will not be exhaustively listed in the present application.

Preferably, the curing is carried out for a period of 60-300 min, for example, 80 min, 100 min, 120 min, 150 min, 180 min, 200 min, 220 min, 240 min, 260 min or 280 min, or specific point values between any two of the above point values, and for the space limitation and concision consideration, the specific point values included in the range will not be exhaustively listed in the present application.

In a sixth aspect, the present application provides a printed circuit board, and the printed circuit board comprises at least one of the insulating resin film according to the second aspect, the resin-coated copper foil according to the third aspect, the prepreg according to the fourth aspect, and the metal foil clad laminate according to the fifth aspect.

Compared with the prior art, the present application has the beneficial effects below:

(1) In the resin composition provided by the present application, the hydrogenated hydrocarbon resin and the benzocyclobutene resin with a specific structure are both total-hydrocarbon structures, which have low dielectric constant Dk, low dielectric loss tangent Df, and low water absorption rate; meanwhile, the benzocyclobutene resin can be thermally cured to obtain the high cross-linking density, high glass transition temperature, and excellent heat resistance. The resin composition and the insulating resin film prepared therewith have ultra-low dielectric constant, ultra-low dielectric loss tangent, and excellent dielectric properties, and at the same time have excellent heat resistance, damp heat resistance, adhesion strength, and excellent mechanical properties such as flexibility, satisfying the performance requirements of electronic components being high frequency, high speed, and high integration.

(2) By the component design and optimization of the resin composition in the present application, the insulating resin film and the copper clad laminate containing the resin composition is enabled to have Dk of less than or equal to 3.2 and Df of less than 0.0008 at 10 GHZ, and the glass transition temperature is 180-200° C., the heat resistance at 300° C. is more than 60 min, the PCT 6 h test for damp heat resistance is passed, the peel strength is 0.85-1.85 N/mm, the bending angle is more than or equal to 120°, and the 24 h solvent resistance test is passed: the materials have excellent dielectric properties, heat resistance, damp heat resistance, chemical resistance, mechanical properties, and good reliability, which can be used as high-performance insulating dielectric materials to enhance signal transmission speed and reduce signal propagation loss.

DETAILED DESCRIPTION

Figure 1:
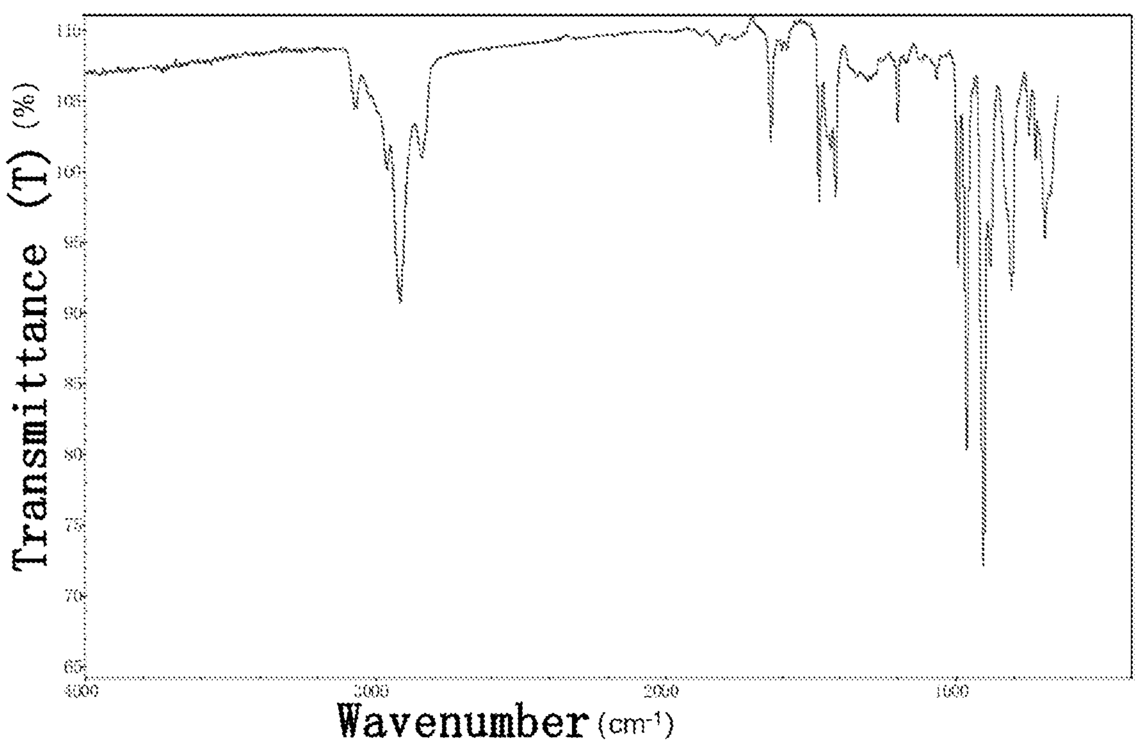
FIG. 1 shows an infrared spectrum of the benzocyclobutene resin CH-BCB2 provided in Preparation Example 1.

The technical solutions of the present application are further described below through embodiments. It should be apparent to those skilled in the art that the embodiments are merely used for a better understanding of the present application and should not be regarded as a specific limitation on the present application.

In an embodiment, the benzocyclobutene resin is obtained by subjecting a hydrocarbon resin and 4-halogen benzocyclobutene ( 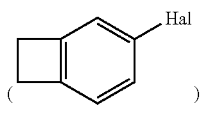 )

to coupling reaction; the hydrocarbon resin comprises polybutadiene or a styrene-butadiene copolymer, which comprises a structural unit

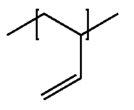

formed by butadiene 1,2-polymerization; Hal is a halogen, which may be, for example, Cl, Br or I.

In an embodiment, the Hal is Br, which means that a raw material is 4-bromobenzocyclobutene ( 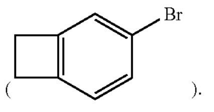 ).

In an embodiment, the coupling reaction is carried out in the presence of a palladium catalysis system.

In an embodiment, the palladium catalysis system comprises a palladium catalyst and an organophosphine ligand.

In an embodiment, the palladium catalyst is palladium acetate and the organophosphine ligand is tris(o-methylphenyl)phosphine.

In an embodiment, the coupling reaction is carried out in the presence of an acid binding agent.

In an embodiment, the acid binding agent comprises an organic base, more preferably triethylamine.

In an embodiment, the coupling reaction is carried out in an inert protective atmosphere, and the inert protective atmosphere comprises any one of a nitrogen atmosphere, an argon atmosphere, and a helium atmosphere.

In an embodiment, the coupling reaction has a temperature of 60-100° C., which may be, for example, 65° C., 70° ° C., 75° C., 80° C., 85° C., 90° ° C. or 95° C.

In an embodiment, the coupling reaction is carried out for a period of 5-36 h, which may be, for example, 6 h, 8 h, 10 h, 12 h, 14 h, 16 h, 18 h, 20 h, 24 h, 28 h, 32 h or 34 h.

In an embodiment, the preparation of the benzocyclobutene resin further comprises an optional step of hydrogenation reaction, which may be carried out before and/or after the coupling reaction, and the hydrogenation reaction may be full hydrogenation (which means that all of the C═C on the main and branched chains of the benzocyclobutene resin is hydrogenated, preferably, after the coupling reaction) or partial hydrogenation (which may be carried out before or after the coupling reaction). The hydrogenation reaction fully or partially hydrogenates the C═C double bonds of the hydrocarbon resin (for example, polybutadiene and/or a styrene-butadiene copolymer) to form saturated carbon chains (which means that $R_1$ is ethylidene and/or $R_2$ is ethyl); accordingly, the dielectric properties of the benzocyclobutene resin can be further improved.

The preparation method of the benzocyclobutene resin will be described hereinafter with reference to specific preparation examples: in the preparation examples, the specific information of the hydrocarbon resin involved is shown below:

B1000, polybutadiene, the structural unit formed by butadiene 1,2-polymerization ( 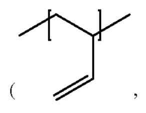 , similarly hereinafter) has a molar percentage of 85%, and the structural unit formed by 1,4-polymerization ( 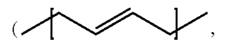 , similarly hereinafter) has a molar percentage of 15%, Nippon Soda Co., Ltd.;

B2000, polybutadiene, the structural unit formed by 1,2-polymerization has a molar percentage of 88%, and the structural unit formed by 1,4-polymerization has a molar percentage of 12%, Nippon Soda Co., Ltd.;

B3000, polybutadiene, the structural unit formed by 1,2-polymerization has a molar percentage of 92%, and the structural unit formed by 1,4-polymerization has a molar percentage of 8%, Nippon Soda Co., Ltd.;

BI3060, partially hydrogenated polybutadiene resin, the structural unit formed by 1,2-polymerization has a molar percentage of 60%, the structural unit

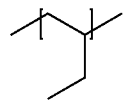

has a molar percentage of 32%, and the structural unit formed by 1,4-polymerization has a molar percentage of 8%, Nippon Soda Co., Ltd.;

Ricon 154, polybutadiene, the structural unit formed by 1,2-polymerization has a molar percentage of 90%, and the structural unit formed by 1,4-polymerization has a molar percentage of 10%, Sartomer Americas;

Ricon 184, butadiene-styrene copolymer, the structural unit formed by 1,2-polymerization has a molar percentage of 30%, the structural unit formed by 1,4-polymerization has a molar percentage of 48%, and the styrene structural unit

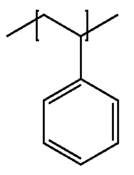

has a molar percentage of 22%, Sartomer Americas:

Ricon 100, butadiene-styrene copolymer, the structural unit formed by 1,2-polymerization has a molar percentage of 70%, the structural unit formed by 1,4-polymerization has a molar percentage of 8%, and the styrene structural unit has a molar percentage of 22%, Sartomer Americas.

Preparation Example 1

A benzocyclobutene resin CH-BCB2 is provided, the preparation method of which is as follows:

as shown in Table 1, 169.44 g of 4-bromobenzocyclobutene (4-bromo-BCB), 100 g of poly butadiene B2000, 16.35 g of tris(o-methylphenyl)phosphine, 7.48 g of palladium acetate, 500 g of triethylamine and 1000 g of acetonitrile were added to a flask and reacted with stirring in an argon atmosphere at 85° C. for 24 h: the system was cooled and rotary-evaporated to dry the solvent; the residue was quickly passed through a column with neutral alumina, and rotary-evaporated to dry the solvent to obtain a viscous liquid; the viscous liquid was dissolved with toluene, then added with methanol in 4 times the amount of toluene, shaken thoroughly, and then allowed to stand, and the toluene layer was separated out: the residue was rotary-evaporated and concentrated and dried under vacuum to obtain a colorless viscous liquid, that is, benzocyclobutene resin CH-BCB2.

A Fourier transform infrared spectrometer (FTIR, IS10 FT-IR, Thermo Fisher) is used to characterize the structure of the benzocyclobutene resin CH-BCB2, and the infrared spectrum obtained is shown in FIG. 1. As can be seen from FIG. 1, the characteristic absorption peak at 1473 cm-1 which is assigned to the four-membered ring of benzocyclobutene indicates the CH-BCB2 resin contains the benzocyclobutene structure; the TLC column chromatography shows that the raw material disappears, indicating that the benzocyclobutene structure is completely grafted onto the polybutadiene.

Figure 2:
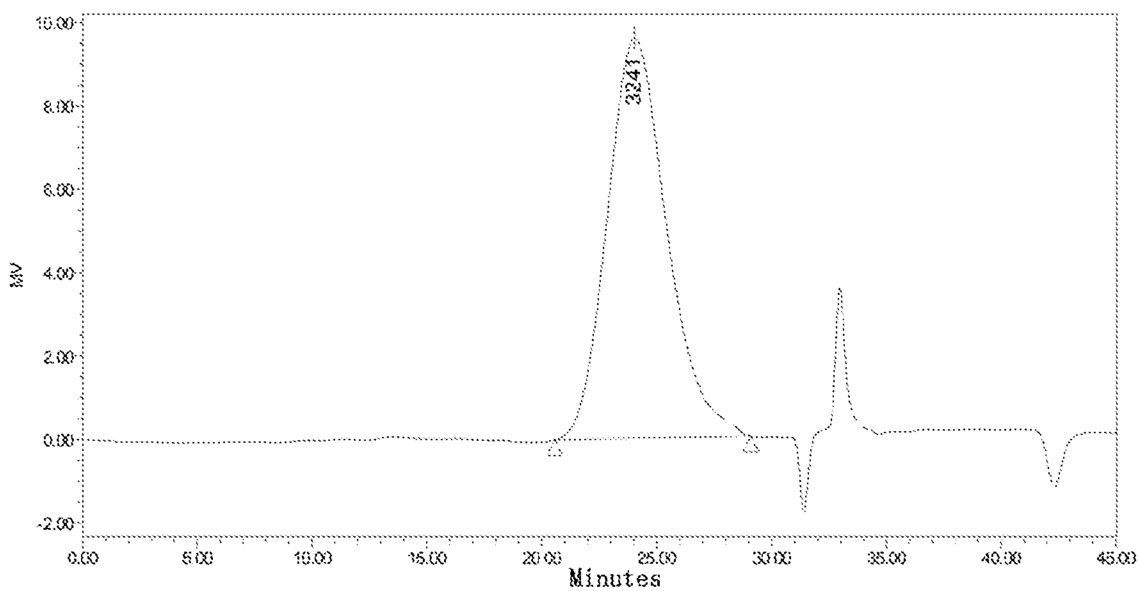
FIG. 2 shows a GPC spectrum of the benzocyclobutene resin CH-BCB2 provided in Preparation Example 1.

With reference to GB/T 21863-2008, the molecular mass of the benzocyclobutene resin CH-BCB2 is determined by gel permeation chromatography (GPC) based on the polystyrene calibrant, and the GPC spectrum obtained is shown in FIG. 2. In FIG. 2, the marked "3241" is the viscosity average molecular mass of the benzocyclobutene resin CH-BCB2, and its number average molecular mass (Mn) is 2416.

Preparation Examples 2-7

A benzocyclobutene resin CH-BCB2 is provided, the preparation method of which differs from Preparation Example 1 in the species and amounts of the raw materials used, as shown in Table 1 specifically: the process parameters not shown in Table 1 are the same as those in Preparation Example 1. In Table 1, the structural unit A (%), structural unit B (%), and structural unit C (%) represent their respective molar percentages in the benzocyclobutene resin: the structural unit A (%) and structural unit B (%) are calculated from the addition amount of 4-bromo-BCB and the molar percentage of the structural unit formed by 1,2-polymerization in the resin raw material (the thin-layer chromatography was is employed in the preparation for monitoring to ensure that 4-bromo-BCB is completely reacted, and therefore, 4-bromo-BCB is completely converted into structural unit A, and the difference between the molar percentages of structural unit formed by 1,2-polymerization in the resin raw material and structural unit A is the amount of structural unit B (in a case where the resin raw material is polybutadiene); if the resin raw material is a butadiene-styrene copolymer, the molar percentage of structural unit B is calculated by the difference between the molar percentages of structural unit formed by 1,2-polymerization in the resin raw material and structural unit A plus the molar percentage of styrene structural unit: the structural unit C is derived from the hydrocarbon resin (polybutadiene or a butadiene-styrene copolymer), which is obtained from the raw material manufacturer.

TABLE 1

| | CH-BCB1 | CH-BCB2 | CH-BCB3 | CH-BCB4 | CH-BCB5 | CH-BCB6 | CH-BCB7 |
|---|---|---|---|---|---|---|---|
| Resin species | B1000 | B2000 | B3000 | BI3060 | Ricon 154 | Ricon 184 | Ricon 100 |
| Resin mass/g | 100 | 100 | 100 | 100 | 100 | 100 | 100 |
| 4-Bromo-BCB/g | 101.67 | 169.44 | 271.11 | 33.89 | 16.94 | 60.61 | 60.61 |
| Tris(o-methylphenyl)phosphine/g | 9.81 | 16.35 | 26.15 | 3.27 | 1.63 | 5.85 | 5.85 |
| Palladium acetate/g | 4.49 | 7.48 | 11.97 | 1.50 | 0.75 | 2.68 | 2.68 |
| Triethylamine/g | 300 | 500 | 800 | 100 | 60 | 200 | 200 |
| Acetonitrile/g | 1000 | 1000 | 2000 | 500 | 200 | 700 | 700 |
| Structural unit A | 30.00% | 50.00% | 80.00% | 10.00% | 5.00% | 20.00% | 20.00% |

TABLE 1-continued

| | CH-BCB1 | CH-BCB2 | CH-BCB3 | CH-BCB4 | CH-BCB5 | CH-BCB6 | CH-BCB7 |
|---|---|---|---|---|---|---|---|
| Structural unit B | 55.00% | 38.00% | 12.00% | 82.00% | 85.00% | 32.00% | 72.00% |
| Structural unit C | 15.00% | 12.00% | 8.00% | 8.00% | 10.00% | 48.00% | 8.00% |
| Mn | 1235 | 2416 | 3655 | 3197 | 5335 | 9356 | 5106 |

Comparative Preparation Example 1

The method in Example 1 of prior art CN107501459A was used to synthesize the benzocyclobutene resin CH-BCB-D1, which was copolymerized from 4-vinylbiphenyl and 4-vinylbenzocyclobutene.

In the following embodiments of the present application, the materials involved are shown as follows.

(1) Benzocyclobutene Resin
 Benzocyclobutene resins CH-BCB1 to CH-BCB7 provided in Preparation Examples 1-7;
 CH-BCB-D1 provided in Comparative Preparation Example 1.

(2) Hydrogenated Hydrocarbon Resin
 Fully hydrogenated SEBS, KIC19-023, Mn: 40000, Shanghai Kraton;
 Fully hydrogenated SEBS, XPH-201-H, Mn: 120000, Shanghai Kraton;
 Fully hydrogenated SEBS, H1221, Mn: 90000, Asahi Kasei, Japan;
 Fully hydrogenated SEBS, P2000, Mn: 50000, Asahi Kasei, Japan;
 Fully hydrogenated polybutadiene, BI-3000, Mn: 3000, Nippon Soda;
 Partially hydrogenated polybutadiene, BI-3060, Mn: 3000, Nippon Soda.

(3) Initiator
 Tert-butyl isopropyl phenyl peroxy, BIPB, Hunan Farida.

(4) Filler
 Silica, HM102YJ, Jiangsu Finetal.

(5) Flame Retardant
 SYTELX 8010, Albemarle, USA.

Example 1

A resin composition comprises the following components in parts by mass: 30 parts of benzocyclobutene resin CH-BCB1, 70 parts of SEBS (XPH-201-H), 300 parts of silica, and 10 parts of flame retardant SYTELX 8010.

An insulating resin film and a copper clad laminate comprising the resin composition are provided, the preparation method of which are as follows:

(1) various components of the resin composition were mixed with toluene according to the formulation amounts to prepare a resin adhesive liquid with a solid content of 65%;
(2) the resin adhesive liquid obtained in step (1) was coated on one side of a release film (PET film) and placed into an oven and baked at 130° ° C. for 4 min to remove the solvent, so as to obtain the insulating resin film; and
(3) ten of the insulating resin films obtained in step (2) are laminated, clad with HOZ HVLP2 copper foils on both sides, and subjected to thermal press curing at 210° ° C., 30 kg/$cm^2$ for 120 min to obtain the copper clad laminate.

The performance of the copper clad laminate is tested as follows:

(1) glass transition temperature Tg: a dynamic mechanical analyzer (DMA) Rheometric RSAIII is used for the test:
(2) dielectric constant Dk and dielectric loss tangent Df: the split post dielectric resonator (SPDR) method and a dielectric analyzer HP Agilent E4991A are used for the test at a frequency of 10 GHz:
(3) peel strength PS: the peel strength between copper foil and circuit carrier board is determined after thermal stress with reference to IPC-TM-650 2.4.8 C standard:
(4) damp heat resistance PCT: PCT is carried out for 6 h; the copper foil of the laminate is etched and made into three 100 mm×100 mm samples: the samples are placed in a pressure cooker and treated at 105° C. and 103.4 KPa for 360 min, and then impregnated in a 288° C. tin furnace, and the time when delamination and blistering occur is determined. If the time is less than 300 s, the specific time value will be recorded; if the time reaches 5 min, the test will be stopped and ">300 s" will be recorded. The mark ○ means that there is no delamination and blistering within 300 s, and the sample is qualified in damp heat resistance: x means that there is delamination and blistering within 300 s, and the sample is not qualified in damp heat resistance;
(5) heat resistance T300: the heat resistance of material is determined with reference to IPC-TM-650 2.4.24.1 standard:
(6) flame resistance: the flame resistance is determined with reference to UL 94 standard:
(7) bending angle: the laminate obtained by pressing the above resin adhesive film is subjected to etching to remove its copper foil and is prepared into 80 mm×80 mm samples, the samples are bended to determine the bending angle where the fracture occurs: a larger angle indicates a better flexibility:
(8) chemical resistance (solvent resistance): the laminate is immersed in toluene at 25° C. for one day, and then taken out and dried; then the laminate is observed to see whether blistering or delamination occurs. No appearance change of the laminate means the chemical resistance is good, marked as √; blistering or delamination means the chemical resistance is bad, marked as x;

the test results are shown in Table 2.

Examples 2-8, Comparative Examples 1-4

A resin composition and an insulating resin film and a copper clad laminate comprising the same are provided, which differ from Example 1 in the formulation of the resin composition, as shown in Table 2 and Table 3 specifically; the unit of amount of each component is "part", and "--" represents the absence of the component; the preparation method and performance testing method of the insulating resin film and the copper clad laminate are the same as those in Example 1.

TABLE 2

| | | Example 1 | Example 2 | Example 3 | Example 4 | Example 5 | Example 6 |
|---|---|---|---|---|---|---|---|
| Benzocyclobutene resin | CH-BCB1 | 30 | — | — | — | — | — |
| | CH-BCB2 | — | 20 | — | — | — | — |
| | CH-BCB3 | — | — | 20 | 10 | — | — |
| | CH-BCB4 | — | — | — | — | 40 | — |
| | CH-BCB5 | — | — | — | — | — | 50 |
| | CH-BCB6 | — | — | — | — | — | — |
| | CH-BCB7 | — | — | — | — | — | — |
| Comparative benzocyclobutene resin | CH-BCB-D1 | — | — | — | — | — | — |
| Benzocyclobutene monomer | 4-bromo-BCB | — | — | — | — | — | — |
| Hydrocarbon resin | B2000 | — | — | — | — | — | — |
| Hydrogenated hydrocarbon resin | KIC19-023 | — | — | — | 90 | — | — |
| | XPH-201-H | 70 | — | — | — | — | — |
| | H1221 | — | 80 | 80 | — | — | — |
| | P2000 | — | — | — | — | — | — |
| | BI-3000 | — | — | — | — | 60 | 50 |
| | BI-3020 | — | — | — | — | — | — |
| Initiator | BIPB | — | — | — | — | — | — |
| Filler | HM102YJ | 300 | 200 | 200 | — | 50 | 100 |
| Flame retardant | SYTELX 8010 | 10 | 20 | 28 | 30 | 40 | 28 |
| Performance test results | | | | | | | |
| Tg | ° C. | 200 | 202 | 187 | 190 | 180 | 181 |
| Dk | 10 GHz | 3.20 | 3.10 | 3.10 | 2.38 | 2.50 | 2.80 |
| Df | 10 GHz | 0.00080 | 0.00070 | 0.00080 | 0.00060 | 0.00050 | 0.00055 |
| PS | N/mm | 1.05 | 1.18 | 1.15 | 1.85 | 0.85 | 0.92 |
| PCT | 6 h | ○○○ | ○○○ | ○○○ | ○○○ | ○○○ | ○○○ |
| T300 | min | >60 | >60 | >60 | >60 | >60 | >60 |
| Flame resistance | | V-0 | V-0 | V-0 | V-0 | V-0 | V-0 |
| Bending angle | ° | >150 | >150 | >150 | >150 | >150 | 140 |
| Chemical resistance | | ✓ | ✓ | ✓ | ✓ | ✓ | ✓ |

TABLE 3

| | | Example 7 | Example 8 | Comparative Example 1 | Comparative Example 2 | Comparative Example 3 | Comparative Example 4 |
|---|---|---|---|---|---|---|---|
| Benzocyclobutene resin | CH-BCB1 | — | — | — | — | — | — |
| | CH-BCB2 | — | — | — | — | — | — |
| | CH-BCB3 | — | — | 5 | — | — | — |
| | CH-BCB4 | — | — | — | — | — | — |
| | CH-BCB5 | — | — | — | — | — | — |
| | CH-BCB6 | 60 | — | — | — | — | — |
| | CH-BCB7 | — | 70 | — | 80 | — | — |
| Comparative benzocyclobutene resin | CH-BCB-D1 | — | — | — | — | 70 | — |
| Benzocyclobutene monomer | 4-Bromo-BCB | — | — | — | — | — | 12.58 |
| Hydrocarbon resin | B2000 | — | — | — | — | — | 7.42 |
| Hydrogenated hydrocarbon resin | KIC19-023 | — | — | 95 | — | — | — |
| | XPH-201-H | — | — | — | — | — | — |
| | H1221 | — | — | — | — | — | 80 |
| | P2000 | — | 30 | — | 20 | 30 | — |
| | BI-3000 | — | — | — | — | — | — |
| | BI-3020 | 40 | — | — | — | — | — |
| Initiator | BIPB | 3 | 0.5 | — | — | 0.5 | 0 |
| Filler | HM102YJ | 100 | 100 | — | 100 | 100 | 200 |
| Flame retardant | SYTELX 8010 | 28 | 28 | 28 | 28 | 28 | 20 |
| Performance test results | | | | | | | |
| Tg | ° C. | 260 | 250 | 160 | 255 | 220 | 160 |
| Dk | 10 GHz | 2.80 | 2.50 | 2.38 | 2.80 | 2.60 | 3.20 |

TABLE 3-continued

| | | Example 7 | Example 8 | Comparative Example 1 | Comparative Example 2 | Comparative Example 3 | Comparative Example 4 |
|---|---|---|---|---|---|---|---|
| Df | 10 GHz | 0.00080 | 0.00070 | 0.00060 | 0.00065 | 0.00090 | 0.00100 |
| PS | N/mm | 0.89 | 0.85 | 1.85 | 0.7 | 0.65 | 1 |
| PCT | 6 h | ○○○ | ○○○ | ○○○ | ○○○ | ○○○ | ○○○ |
| T300 | min | >60 | >60 | 40 | >60 | >60 | 42 |
| Flame resistance | | V-0 | V-0 | V-0 | V-0 | V-0 | V-0 |
| Bending angle | ° | 120 | 120 | >150 | 70 | 90 | >150 |
| Chemical resistance | | ✓ | ✓ | X | ✓ | ✓ | X |

Combining the performance test data in Table 2 and Table 3, it can be seen that by employing the resin composition provided by the present application to prepare the insulating resin film and copper clad laminate, Dk of the copper clad laminate is 2.38-3.20 at 10 GHz, Df is 0.0005-0.0008, the glass transition temperature Tg is 180-200° C., the PCT 6 h test is passed, the heat resistance at 300° C. is more than 60 min, the peel strength is 0.85-1.85 N/mm, the bending angle is more than or equal to 120°, the flame resistance reaches V-0, and the 24 h solvent resistance test is passed; the materials provided by the present application have excellent dielectric properties, heat resistance, damp heat resistance, chemical resistance and mechanical properties, and the reliability is good.

The amount of benzocyclobutene resin in Comparative Example 1 is too low, resulting in the copper clad laminate having low glass transition temperature, insufficient heat resistance and poor solvent resistance: the amount of benzocyclobutene resin in Comparative Example 2 is too high, and the heat resistance and dielectric properties become better, but the key flexibility, i.e., bending angle, becomes very low, indicating that the flexibility is poor. The resin composition of Comparative Example 3 does not contain the benzocyclobutene resin with the limited structure of the present application, and does not contain the reactive C═C double bond, and thus has low Tg; besides, due to containing a high content of the benzene ring in its structure, the resin composition of Comparative Example 3 has poor dielectric properties and low bending angle, i.e., poor flexibility. For the resin composition of Comparative Example 4, polybutadiene B2000 and 4-bromobenzocyclobutene are physically mixed according to the ratio in Preparation Example 2 and then added with other components same as in Example 2: because the benzocyclobutene has not been grafted onto the butadiene-styrene resin, the 4-bromobenzocyclobutene basically volatilizes away during the pre-curing process, resulting in a significant deterioration in the dielectric properties as well as in heat and solvent resistance of the Comparative Example 4.

The applicant declares that the resin composition, the insulating resin film, and the use thereof of the present application are illustrated by the embodiments in the present application, but the present application is not limited to the above process steps, which means that the present application is not necessarily relied upon the above process steps to be implemented. It should be clear to those skilled in the art that any improvement of the present application, equivalent substitution of the raw materials selected for the present application, addition of auxiliary ingredients, selection of specific methods, etc., shall fall within the protection scope and disclosure scope of the present application.

What is claimed is:

1. A resin composition, comprising the following components in parts by mass: 50-90 parts of a hydrogenated hydrocarbon resin and 10-50 parts of a benzocyclobutene resin;

the benzocyclobutene resin comprises at least one structural unit A and at least one structural unit B;

the structural unit A has a structure as shown in formula I:

formula I

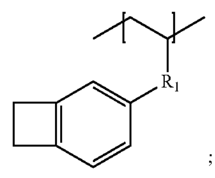

;

$R_1$ is vinylidene and/or ethylidene, wherein the structural unit A of the benzocyclobutene resin has a molar percentage of more than or equal to 5-80%;

the structural unit B has a structure as shown in formula II:

formula II

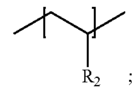

;

$R_2$ is vinyl, ethyl and/or phenyl, wherein the structural unit B of the benzocyclobutene resin has a molar percentage of 15-85%, wherein the benzocyclobutene resin further comprises structural unit C, and the structural unit C has a structure as shown in formula IIIA and/or a structure as shown in formula IIIB:

formula IIIA

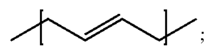

;

formula IIIB

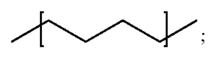

;

wherein the structural unit C of the benzocyclobutene resin has a molar percentage of 8-48%;

wherein the hydrogenated hydrocarbon resin comprises any one or a combination of at least two of a hydrogenated styrene-butadiene copolymer, a maleic anhydride grafted hydrogenated styrene-butadiene copolymer, and hydrogenated polybutadiene, and wherein the hydrogenated hydrocarbon resin has a number average molecular mass of 20000-120000.

2. The resin composition according to claim 1, wherein the hydrogenated hydrocarbon resin comprises a fully hydrogenated hydrocarbon resin and/or a partially hydrogenated hydrocarbon resin.

3. The resin composition according to claim 1, wherein the structural unit C of the benzocyclobutene resin has a molar percentage of 8-40%.

4. The resin composition according to claim 1, wherein the benzocyclobutene resin has a number average molecular mass of 1000-20000.

5. The resin composition according to claim 1, wherein the resin composition further comprises an initiator.

6. The resin composition according to claim 1, wherein the resin composition further comprises a filler.

7. The resin composition according to claim 1, wherein the resin composition further comprises a flame retardant.

8. An insulating resin film, wherein a material of the insulating resin film comprises the resin composition according to claim 1.

9. A metal foil clad laminate, wherein the metal foil clad laminate comprises the insulating resin film according to claim 8.

10. A printed circuit board, wherein the printed circuit board comprises the insulating resin film according to claim 8.

11. A resin-coated copper foil, wherein the resin-coated copper foil comprises a copper foil layer and a resin layer, and a material of the resin layer comprises the resin composition according to claim 1.

12. A metal foil clad laminate, wherein the metal foil clad laminate comprises the resin-coated copper foil according to claim 11.

13. A prepreg, wherein the prepreg comprises a reinforcing material and the resin composition according to claim 1 adhered on the reinforcing material.

14. The prepreg according to claim 13, wherein the resin composition is adhered on the reinforcing material by impregnation and drying.

15. A metal foil clad laminate, wherein the metal foil clad laminate comprises the prepreg according to claim 13.

* * * * *